US012793749B2

(12) United States Patent
Li et al.

(10) Patent No.: US 12,793,749 B2
(45) Date of Patent: Nov. 10, 2026

(54) POWER HOLD-OFF CIRCUIT

(71) Applicant: Micron Technology, Inc., Boise, ID (US)

(72) Inventors: Hongyan Li, Shanghai (CN); Marco Redaelli, Munich (DE)

(73) Assignee: Micron Technology, Inc., Boise, ID (US)

( * ) Notice: Subject to any disclaimer, the term of this patent is extended or adjusted under 35 U.S.C. 154(b) by 198 days.

(21) Appl. No.: 18/834,861

(22) PCT Filed: Nov. 17, 2022

(86) PCT No.: PCT/CN2022/132496
§ 371 (c)(1),
(2) Date: Jul. 31, 2024

(87) PCT Pub. No.: WO2024/103330
PCT Pub. Date: May 23, 2024

(65) Prior Publication Data
US 2025/0140293 A1 May 1, 2025

(51) Int. Cl.
*G11C 5/14* (2006.01)
*G11C 11/4074* (2006.01)

(52) U.S. Cl.
CPC .............. *G11C 5/147* (2013.01); *G11C 5/141* (2013.01); *G11C 5/143* (2013.01); *G11C 11/4074* (2013.01)

(58) Field of Classification Search
CPC ......... G11C 5/147; G11C 5/141; G11C 5/143; G11C 11/4074; G06F 1/30
USPC ......................................................... 365/226
See application file for complete search history.

(56) References Cited

U.S. PATENT DOCUMENTS

| | | | | |
|---|---|---|---|---|
| 8,957,655 | B2 | 2/2015 | Galinski, III | |
| 9,747,957 | B1 | 8/2017 | Stickel | |
| 11,404,906 | B1 * | 8/2022 | Wang | H02M 1/008 |
| 2021/0265913 | A1 | 8/2021 | Cannillo et al. | |

OTHER PUBLICATIONS

International Search Report—PCT/CN2022/0132496—ISA/CN—Jul. 28, 2023.

* cited by examiner

*Primary Examiner* — Huan Hoang
(74) *Attorney, Agent, or Firm* — Harrity & Harrity, LLP

(57) ABSTRACT

Implementations described herein relate to a power hold-off circuit and power hold-off circuit operation. In some implementations, a system may include a battery, and a power hold-off circuit. The power hold-off circuit may include a step-up regulator, a step-down regulator, a first abrupt power-loss (APL) switch, a second APL switch, and one or more power hold-off capacitors. The system may include a third APL switch between the battery and the power hold-off circuit. The third APL switch and the first APL switch may be in a closed state, and the second APL switch may be connected to the step-up regulator, when a voltage from the battery satisfies a voltage threshold. The third APL switch and the first APL switch may be in an open state, and the second APL switch may be connected to the step-down regulator, when the voltage from the battery does not satisfy the voltage threshold.

25 Claims, 5 Drawing Sheets

POWER HOLD-OFF CIRCUIT

CROSS-REFERENCE TO RELATED APPLICATION

This Patent Application is a 371 national stage of PCT Application No. PCT/CN2022/132496, filed on Nov. 17, 2022, entitled "POWER HOLD-OFF CIRCUIT," and assigned to the assignee hereof. The disclosure of the prior Application is considered part of and is incorporated by reference into this Patent Application.

TECHNICAL FIELD

The present disclosure generally relates to memory devices, memory device operations, and, for example, to a power hold-off circuit.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, an electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
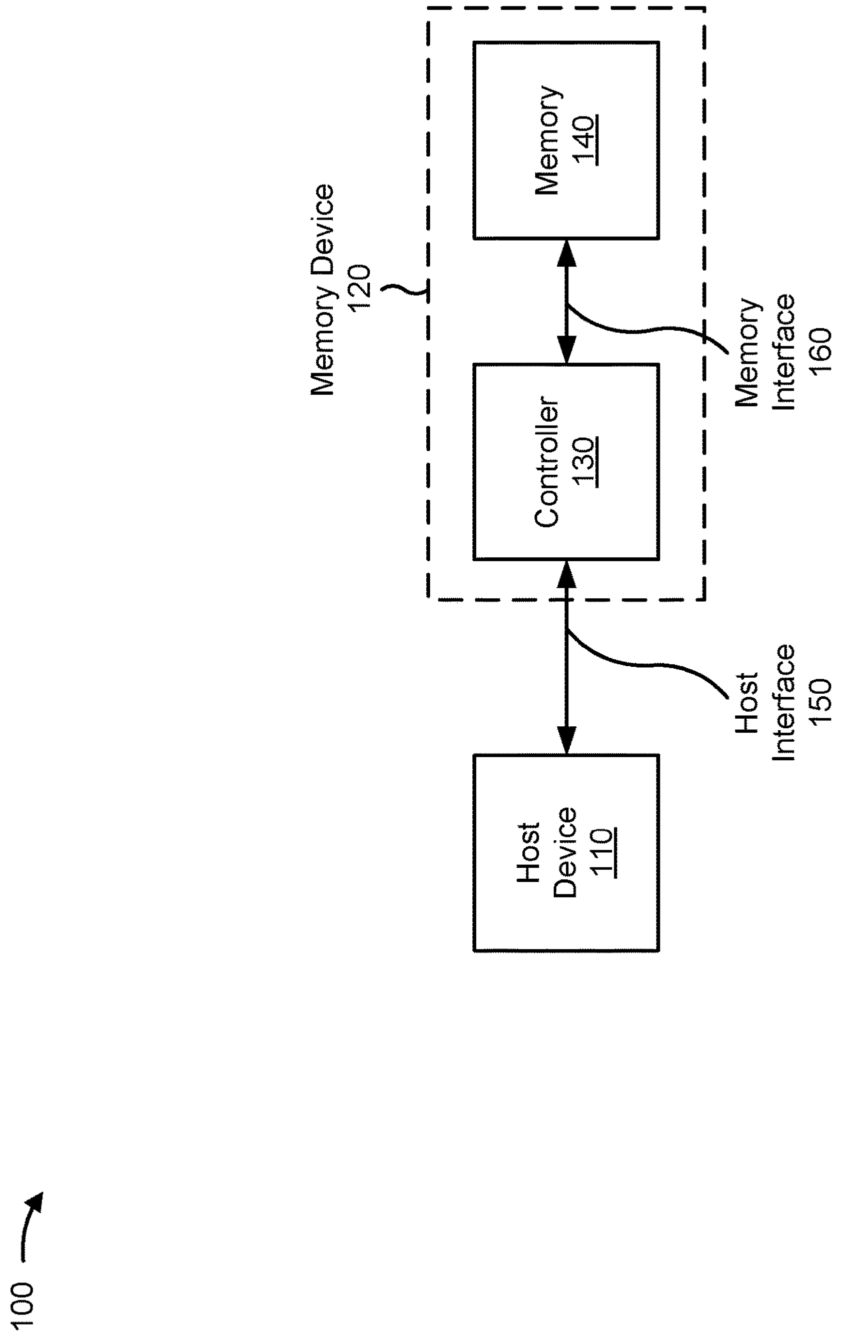
FIG. 1 is a diagram illustrating an example system capable of power hold-off circuit operation.

Centralized storage may be used to enable virtual machines and operating systems from different domains to share data. For example, in an automotive central architecture, the centralized storage may enable the virtual machines and operating systems to share data and to simplify data sharing between functional systems such as in-vehicle infotainment (IVI), Cluster, and advanced driver assistance systems (ADAS), among other examples. Cluster may include various displays and indicators that enable a driver to operate the automobile.

Solid-state drives (SSDs) may require power management circuitry that includes features such as voltage hold-off circuitry and power loss detection to be used for data protection during an abrupt power loss (APL) event. This may be used to prevent any flash translation layer (FTL) damage that may result in performance of a write protect operation. In data center applications, the main system power may be backed-up through a secure and highly available uninterruptable power supply (UPS). Consequently, a power hold time of two seconds to ten seconds (2 s to 10 s) in the case of an APL event may be reasonable. In some cases, an SSD form factor (e.g., for a U2 device) may have a back-up capacitor on board to be used in the case of the APL event. In enterprise applications, for embedded applications such as automotive, industrial, and the Internet of Things (IoT), a smaller SSD (e.g., ball grid array (BGA)) form factor may not be able to have an on-board capacitor, and an optimized design may require a power hold-off time in the range of only thirty milliseconds to one hundred milliseconds (30 ms to 100 ms).

In some cases, a power management integrated circuit (PMIC) and power hold-off circuitry may be located on board the device (e.g., inside of a drive envelope). In some other cases (such as for BGA devices), the PMIC and power hold-off circuitry may be located outside of the drive envelope and may be part of a customer board design. However, the power back-up for the BGA devices may be complex, may have excessive noise, and may be expensive due to the capacitors that are necessary to sustain power for the 30-100 ms. This may be particularly true in automotive applications. For example, the capacitors used in automotive applications may need to have an extended lifetime and an extended operating range of −40 decibels to 130 decibels (−40 dB to 130 dB).

In some implementations, a system may include a battery and a power hold-off circuit. The power hold-off circuit may include a step-up regulator, a step-down regulator, a first switch, a second switch, and one or more power hold-off capacitors. The first switch may be in a closed state during a standard operation (e.g., when a voltage from the battery satisfies a voltage threshold) and may be in an open state during an APL event (e.g., when the voltage from the battery does not satisfy the voltage threshold). When the first switch is in the closed state, the power hold-off capacitors may be charged by the step-up regulator using power from the battery. The second switch may be connected to the step-up regulator during the standard operation but may be connected to the step-down regulator during the APL event. In some implementations, the system may include a third switch. The third switch may be in a closed state during the standard operation and may be in an open state during the APL event. During the standard operation, such as when the battery is connected to the system, a first set of components and a second set of components may be powered by the battery. The first set of components may include devices that do not require a power backup, while the second set of components may require devices that do require a power backup. For example, the first set of components may include a DRAM while the second set of components may include an SSD.

When an APL event occurs, such as when the voltage from the battery drops below the voltage threshold, the one or more power hold-off capacitors may charge the second set of components but may not charge the first set of components. For example, based on an occurrence of the APL event, the third switch may open, the first switch may open, and the second switch may connect to the step-down regulator, thereby enabling the power hold-off capacitors to discharge power to the second set of components but not the first set of components. When the voltage from the battery is in an operating range (such as between 6 volts and 12 volts), the step-up regulator may charge energy into the power hold-off capacitors at a high voltage. When the voltage from the battery is outside of the operating range (such as below 6 volts), a reverse under-voltage over-voltage protection circuit or a safety monitor microcontroller unit (MCU) may stop a reference clock (REFCLK) to abort any host-to-SSD data transfer, may assert a power loss notification (PLN) signal, may disconnect power backed up circuits from the battery, may turn off the step-up regulator, and may turn on the step-down regulator. The output voltage of the step-down regulator may be set close to the under-voltage threshold in order to minimize an inrush current. The power backed-up subsystem may sustain working for a time (such as 5 ms to 25 ms) using the energy that is stored in the power hold-off capacitors. As a result, an optimized solution for power management and power hold-off in low form factor devices (such as BGA) and in automotive or other embedded systems is provided. Additional details are described herein.

FIG. 1 is a diagram illustrating an example system 100 capable of power hold-off circuit operation. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the system 100 may include a battery and a power hold-off circuit, wherein the power hold-off circuit comprises: a step-up regulator; a step-down regulator; a first APL switch; a second APL switch; and one or more power hold-off capacitors. The system 100 may include a third APL switch that is located in a path between the battery and the power hold-off circuit. The third APL switch is in a closed state, the first APL switch is in the closed state, and the second APL switch is connected to the step-up regulator when a voltage from the battery satisfies a voltage threshold. The third APL switch is in an open state, the first APL switch is in the open state, and the second APL switch is connected to the step-down regulator when the voltage from the battery does not satisfy the voltage threshold.

In some implementations, the system 100 may include a memory device; and a power hold-off circuit, wherein the power hold-off circuit comprises: a step-up regulator; a step-down regulator; a first APL switch; a second APL switch; and one or more power hold-off capacitors. The system is configured to receive power from the power hold-off circuit when the first APL switch is in an open state and the second APL switch is connected to the step-down regulator.

In some implementations, the system 100 may include means for powering a memory device using power from a battery based on a voltage satisfying a voltage threshold; and means for powering the memory device using power from a power hold-off circuit based on the voltage not satisfying the voltage threshold.

As indicated above, FIG. 1 is provided as an example. Other examples may differ from what is described with regard to FIG. 1.

Figure 2:
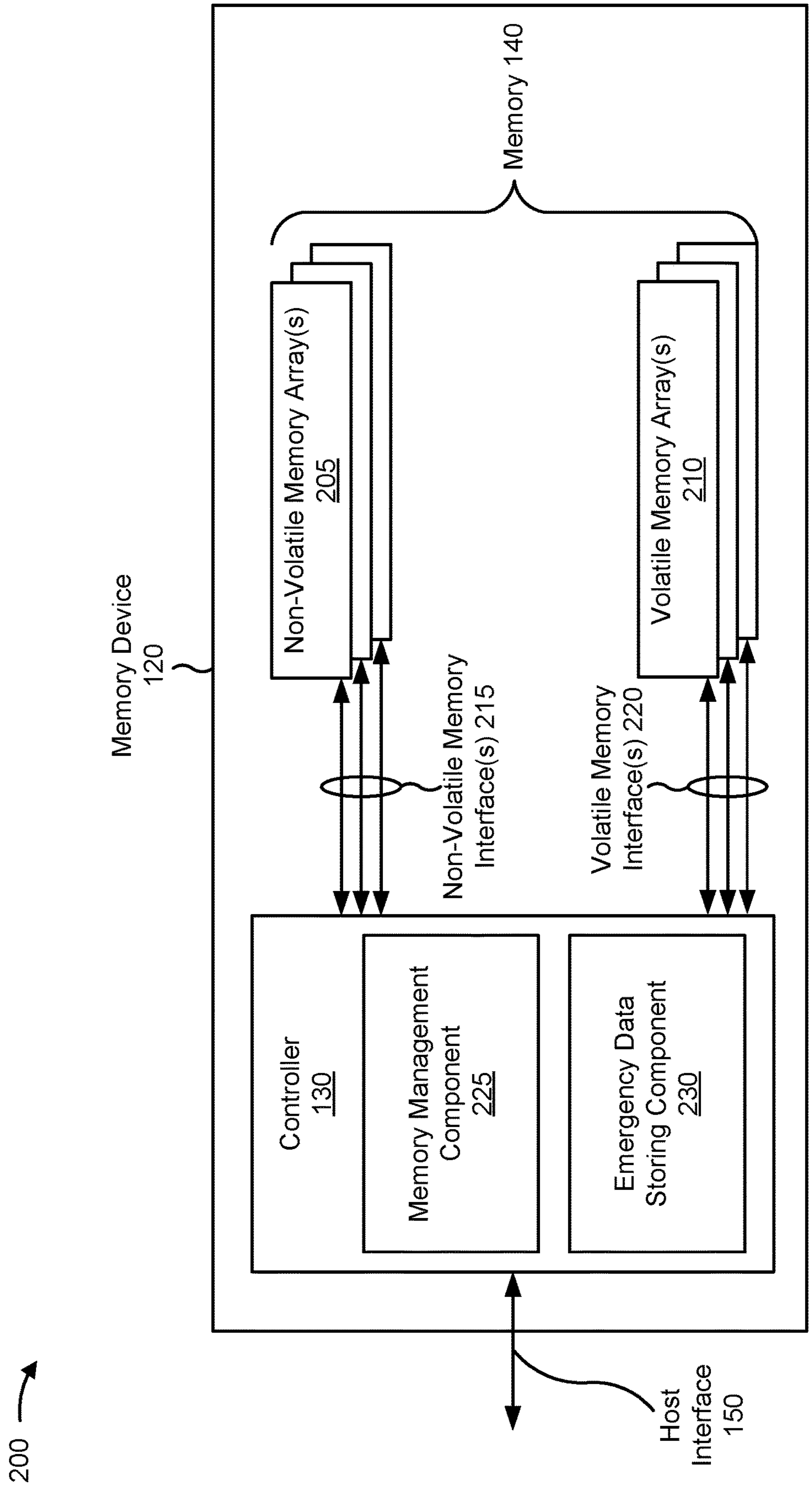
FIG. 2 is a diagram of example components included in a memory device.

FIG. 2 is a diagram of example components 200 included in a memory device 120. As described above in connection with FIG. 1, the memory device 120 may include a controller 130 and memory 140. As shown in FIG. 2, the memory 140 may include one or more non-volatile memory arrays 205, such as one or more NAND memory arrays and/or one or more NOR memory arrays. Additionally, or alternatively, the memory 140 may include one or more volatile memory arrays 210, such as one or more SRAM arrays and/or one or more DRAM arrays. The controller 130 may transmit signals to and receive signals from a non-volatile memory array 205 using a non-volatile memory interface 215. The controller 130 may transmit signals to and receive signals from a volatile memory array 210 using a volatile memory interface 220.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 225 and/or an emergency data storing component 230. In some implementations, one or more of these components are implemented as one or more instructions (e.g., firmware) executed by the controller 130. Alternatively, one or more of these components may be implemented as dedicated integrated circuits distinct from the controller 130.

The memory management component 225 may be configured to manage performance of the memory device 120. For example, the memory management component 225 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 225, such as information regarding memory block age, memory block erase count, and/or error information associated with a memory partition (e.g., a memory cell, a row of memory, a block of memory, or the like).

The emergency data storing component 230 may be configured to detect an emergency data storing event and to initiate and/or perform an emergency data storing operation. The emergency data storing event may be an APL event or may be based on an occurrence of the APL event. The APL event may occur when a voltage from a battery that is powering the memory device 120 falls below a voltage threshold. The voltage from the battery may fall below the voltage threshold, for example, when the battery becomes disconnected from the memory device 120. The emergency data storing component 230 and/or the memory device 120 may receive power from a power hold-off circuit based on the occurrence of the APL event, and may perform at least one of an emergency power fail (EPF) data storing operation or a forced quiescence (FQ) data storing operation, among other examples. Additional details are described herein.

One or more devices or components shown in FIG. 2 may be configured to perform operations described elsewhere herein, such as one or more operations and/or methods described in connection with FIG. 3. For example, the controller 130, the memory management component 225 and/or the emergency data storing component 230 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

As indicated above, FIG. 2 is provided as an example. Other examples may differ from what is described with regard to FIG. 2.

Figure 3:
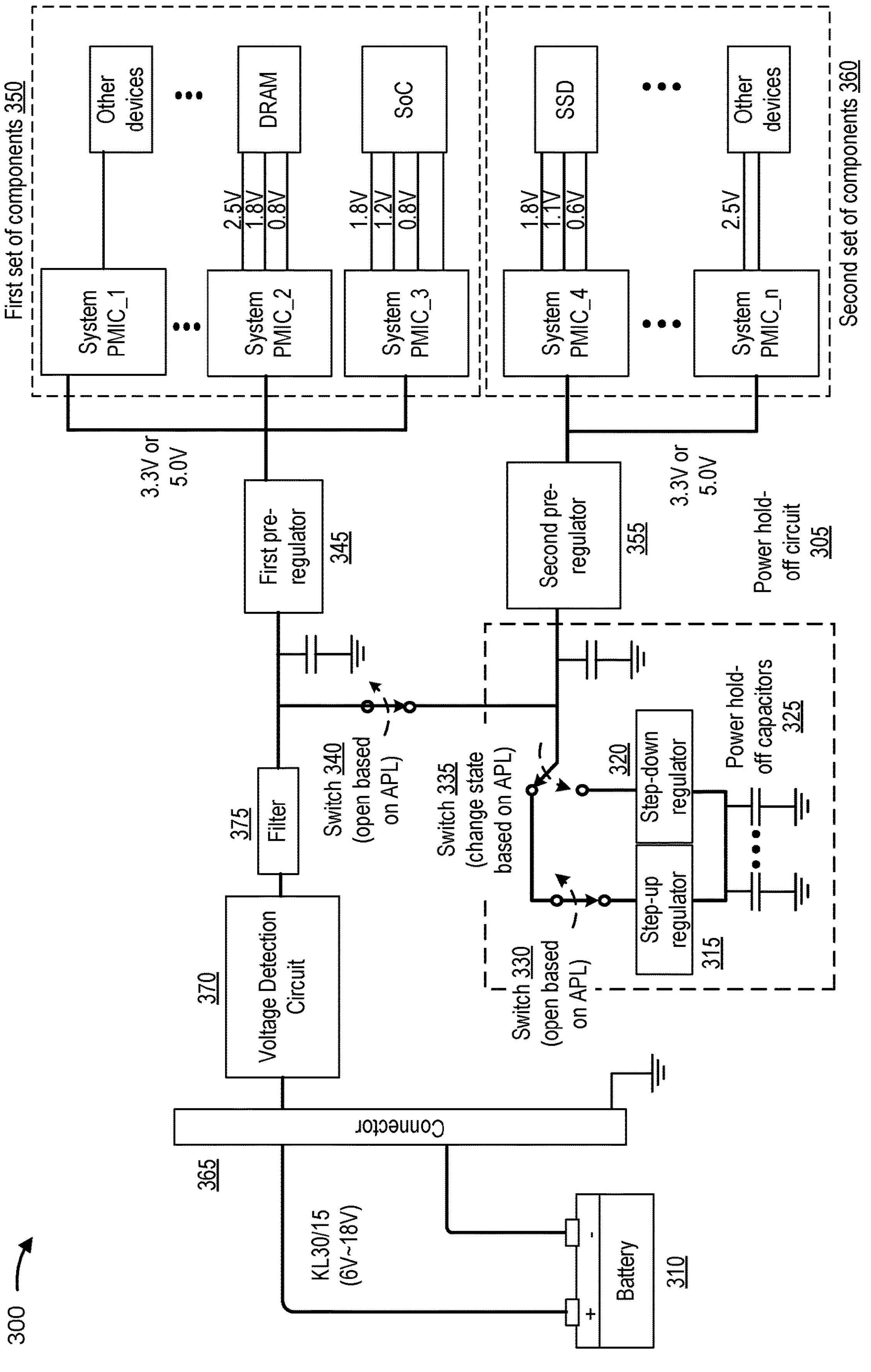
FIG. 3 is a diagram illustrating an example system that includes a power hold-off circuit.

FIG. 3 is a diagram illustrating an example system 300 that includes a power hold-off circuit. The system 300 may include the power hold-off circuit 305 and a battery 310. The power hold-off circuit 305 may include a step-up regulator 315, a step-down regulator 320, and one or more power hold-off capacitors 325. The step-up regulator 315 may be configured to receive an input voltage and to output an output voltage that is higher than the input voltage. The step-up regulator 315 may enable the power hold-off capacitors 325 to be charged at a higher voltage (such as 12 V, 18 V, or 35 V, among other examples). The step-down regulator 320 may be configured to receive an input voltage and to output an output voltage that is lower than the input voltage. The step-down regulator 320 may enable system components or devices that require a power backup for emergency data storing to be charged by the power hold-off capacitors 325 at a lower voltage (such as 3.3 V or 5 V). The power hold-off capacitors 325 may be configured to charge one or more system components or devices when a voltage from the battery falls below a voltage threshold and/or based on an occurrence of an APL event. The APL event may occur, for example, when the battery 310 becomes disconnected from the system 300. The power hold-off circuit 305 may include a first switch 330 and a second switch 335. The first switch 330 may be in a closed state when the voltage from the battery satisfies the voltage threshold and may be in an open state when the volage from the battery does not satisfy the voltage threshold. The second switch 335 may be connected to the step-up regulator 315 when the voltage from the battery satisfies the voltage threshold and may be connected to the step-down regulator 320 when the volage from the battery does not satisfy the voltage threshold.

In some implementations, the system 300 may include a third switch 340. The third switch 340 may be in a closed state when the voltage from the battery satisfies the voltage threshold and may be in an open state when the volage from the battery does not satisfy the voltage threshold. The third switch 340 may be located in a path that is between the power hold-off circuit 305 and the battery 310. The system 300 may include one or more pre-regulators. A first pre-regulator 345 may be located in a path that is between the battery 310 and a first set of components 350. The first set of components 350 may include devices that do not require a power backup and/or may include devices that do not need to perform emergency data storing prior to a power loss. For example, the first set of components 350 may include a DRAM or a system-on-chip (SOC) device. A second pre-regulator 355 may be located in a path that is between the battery 310 and a second set of components 360. The second set of components 360 may include devices that require a power backup in the event of a power loss. For example, the second set of components may include an SSD.

In some implementations, the system 300 may include a connector 365. The connector 365 may be connected to the battery 310 and may be connected to a ground. The system 300 may include a voltage detection circuit 370. The voltage detection circuit 370 may be, for example, a reverse under-voltage over-voltage protection circuit. The voltage detection circuit 370 may be configured to detect whether the voltage from the battery satisfies the voltage threshold. For example, the voltage detection circuit 370 may detect that the voltage from the battery satisfies the voltage threshold based on the voltage from the battery being greater than, or greater than or equal to, the voltage threshold, or may detect that the voltage from the battery does not satisfy the voltage threshold based on the voltage from the battery being less than, or less than or equal to, the voltage threshold. The system 300 may include a filter 375. The filter 375 may be, for example, a low-pass filter, a high-pass filter, a band-pass filter, or a notch filter, among other examples.

In some implementations, the battery 310 may be in a connected state. When the battery 310 is in the connected state, the third switch 340 may be in the closed state, the first switch 330 may be in the closed state, and the second switch 335 may be connected to the step-up regulator 315. The voltage from the battery 310 may satisfy the voltage threshold. For example, the voltage from the battery 310 may be 6 V, 12 V, or 18 V. When the battery 310 is in the connected state, current may flow from the battery 310 to the connector 365, from the connector 365 to the voltage detection circuit 370, and from the voltage detection circuit 370 to the filter 375.

In some implementations, current may flow from the filter 375 to the first pre-regulator 345. For example, current may flow from the filter 375 to a capacitor, from the capacitor to the first pre-regulator 345, and from the first pre-regulator 345 to the first set of components 350. The first pre-regulator 345 may perform voltage regulation and may have an output voltage that is equal to 3.3 V or 5 V. The first set of components 350 may include one or more power management integrated circuits (PMICs), such as PMIC_1, PMIC_2, and PMIC_3. The first set of components 350 may include one or more devices that do not require a power backup based on the occurrence of the APL event. For example, the PMIC_2 may be connected to a DRAM, and the PMIC_3 may be connected to an SOC device.

In some implementations, current may flow from the filter 375 to the second pre-regulator 355. For example, current may flow from the filter 375 to the third switch 340, from the third switch 340 to a capacitor, from the capacitor to the second pre-regulator 355, and from the second pre-regulator 355 to the second set of components 360. The second pre-regulator 355 may perform voltage regulation and may have an output voltage that is equal to 3.3 V or 5 V. The second set of components 360 may include one or more PMICs, such as PMIC_4, and PMIC_n. Each of the PMICs may have an input voltage of 3.3 V or 5 V based on the output of the second pre-regulator 355. The second set of components 350 may include one or more devices that require a power backup based on the occurrence of the APL event. For example, the PMIC_4 may be connected to an SSD.

In some implementations, current may flow from the filter 375 to the power hold-off circuit 305. For example, current may flow from the filter 375 to the third switch 340, and from the third switch 340 to an input of the power hold-off circuit 305. Additionally, current may flow from the input of the power hold-off circuit 305 to the first switch 330, from the first switch 330 to the step-up regulator 315, and from the step-up regulator 315 to the one or more power hold-off capacitors 325. This may enable the one or more power hold-off capacitors 325 to be charged by the step-up regulator 315 using power from the battery 310 at the higher voltage (such as 12 V, 18 V, or 35 V) when the battery 310 is in the connected state.

In some implementations, the system 300 may experience an APL event. The APL event may occur, for example, when the voltage from the battery 310 falls below the voltage threshold, such as when the battery 310 becomes disconnected from the system 300. In some implementations, the voltage detection circuit 370 (such as the reverse under-voltage over-voltage protection circuit) may detect that the voltage from the battery satisfies the voltage threshold based on the voltage from the battery being greater than, or greater than or equal to, the voltage threshold, or may detect that the voltage from the battery does not satisfy the voltage threshold based on the voltage from the battery being less than, or less than or equal to, the voltage threshold. In some implementations, the voltage threshold may be a voltage that is between 5 V and 6 V. For example, the voltage from the battery 310 may drop below a voltage threshold of 5.5 V based on the battery 310 becoming disconnected from the system 300.

When the APL event is detected, the third switch 340 may change from the closed state to the open state, the first switch 330 may change from the closed state to the open state, and the second switch 335 may change from being connected to the step-up regulator 315 to being connected to the step-down regulator 320. When the third switch 340 is in the open state, the first switch 330 is in the open state, and the second switch 335 is connected to the step-down regulator 320, the power hold-off capacitors 325 may discharge power to the second set of components 360. For example, current may flow from the power hold-off capacitors 325 to the step-down regulator 320, from the step-down regulator 320 to the second switch 335, from the second switch 335 to a capacitor, and from the capacitor to the second pre-regulator 355. This may allow the second set of components 360, such as the SSD, to perform an emergency data storing operation prior to experiencing a power loss. In some implementations, the emergency data storing operation may be an EPF data storing operation. In some other implementations, the emergency data storing operation may be an FQ data storing operation. The power hold-off capacitors 325 may be configured to discharge power for a time period (such as 5 ms to 25 ms) that is long enough to allow the second set of components 360 to perform the emergency data storing operation prior to experiencing the power loss. When the third switch 340 is in the open state, the first switch 330 is in the open state, and the second switch 335 is connected to the step-down regulator 320, the power hold-off capacitors 325 may not provide power to the first set of components 350.

As described herein, when voltage from a battery is outside of an operating range, a reverse under-voltage over-voltage protection circuit or a safety MCU may stop a reference clock to abort any host-to-SSD data transfer, may assert a power loss notification (PLN) signal, and may disconnect power backed up circuits from the battery. The step-down regulator may remain on during the standard operation and during the APL, whereas the step-up regulator may be turned off during the APL. The output voltage of the step-down regulator may be set close to the under-voltage threshold in order to minimize an inrush current. The power backed-up subsystem may sustain working for the time (such as 5 ms to 25 ms) using the energy that is stored in the power hold-off capacitors. As a result, an optimized solution for power management and power hold-off in low form factor devices (such as BGA) and in automotive or other embedded systems is provided. The optimized power management and power hold-off solution may result in less electromagnetic interference (EMI) and less noise injected into the lower voltage circuitries (such as the SOC, DRAM, SSD, NAND, or NOR devices, among other examples) since the energy storage may happen close to the 12 V domain and far from the 3.3 V or 5 V domain. This may result in lower SSD cost since the SSD may not be required to have onboard capacitance, and may result in a lower system cost due to the power hold-off circuitry being centralized (and thereby avoiding duplications on individual devices) and due to the reduced capacitance (based on the voltage being stepped-up, thereby reducing the need for additional capacitance). Additionally, this may result in a lower 12 V fast cycling period behavior due to the increased efficiency of the system.

As indicated above, FIG. 3 is provided as an example. Other examples may differ from what is described with regard to FIG. 3.

Figure 4:
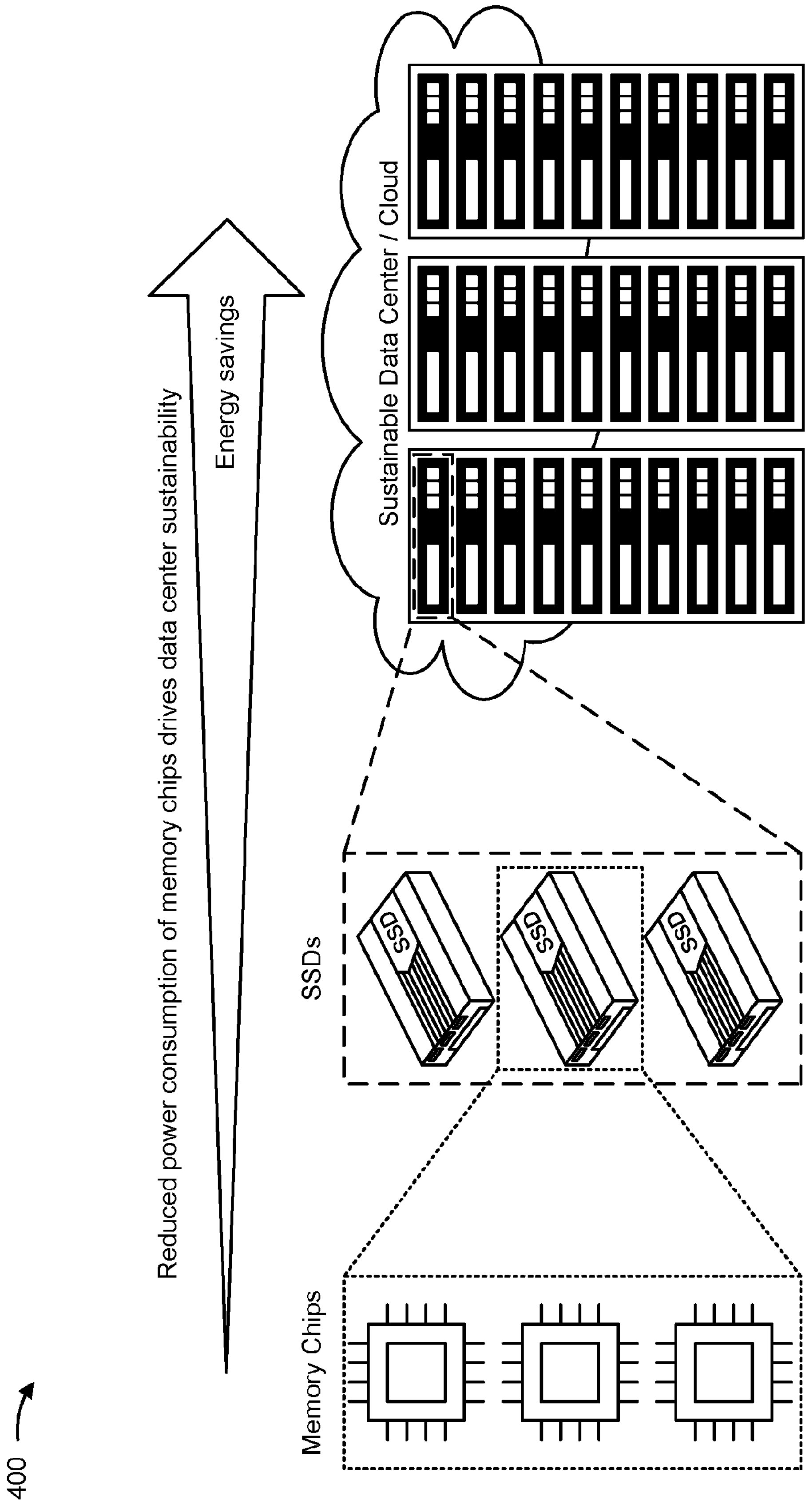
FIG. 4 is a diagram illustrating example systems in which the memory device described herein may be used.

FIG. 4 is a diagram illustrating example systems 400 in which the memory device 120 described herein may be used. In some implementations, one or more memory devices 120 may be included in a memory chip. Multiple memory chips may be packaged together and included in a higher-level system, such as a solid state drive (SSD) or another type of memory drive. Each SSD may include, for example, up to five memory chips, up to ten memory chips, or more. A data center or cloud computing environment may include multiple SSDs to store a large amount of data. For example, a data center may include hundreds, thousands, or more SSDs.

As described above, some implementations described herein reduce power consumption of a memory device 120. As shown in FIG. 4, this reduced power consumption drives data center sustainability and leads to energy savings because of the large volume of memory devices 120 included in a data center.

As indicated above, FIG. 4 is provided as an example. Other examples may differ from what is described with regard to FIG. 4.

Figure 5:
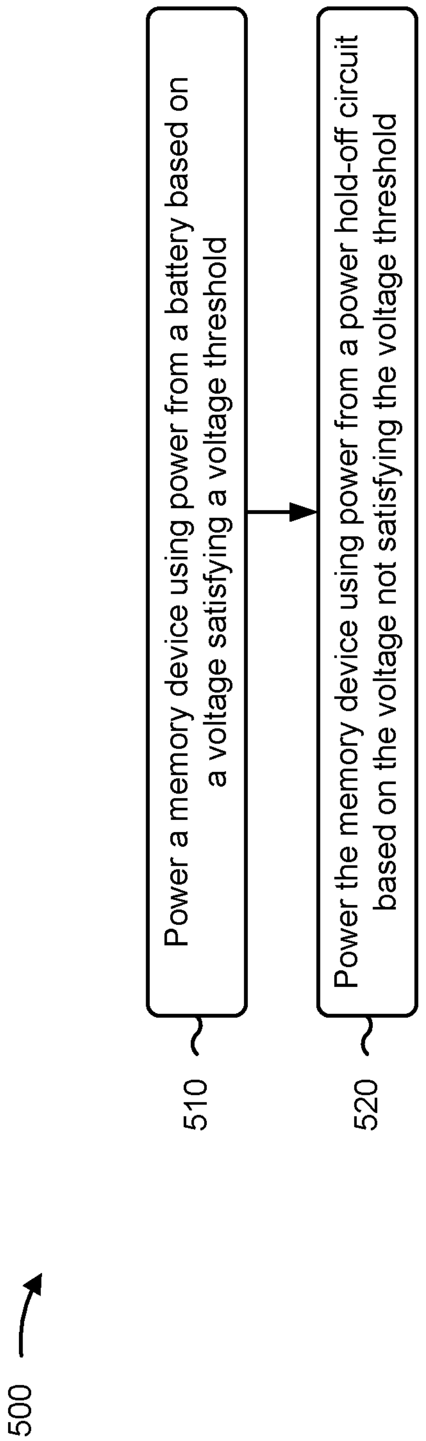
FIG. 5 is a flowchart of an example method associated with power hold-off circuit operation.

FIG. 5 is a flowchart of an example method 500 associated with power hold-off circuit operation. In some implementations, a system (e.g., the system 300) may perform or may be configured to perform the method 500. In some implementations, another device or a group of devices separate from or including the system (e.g., the power hold-off circuit 305) may perform or may be configured to perform the method 500. Additionally, or alternatively, one or more components of the system (e.g., the power hold-off circuit 305) may perform or may be configured to perform the method 500. Thus, means for performing the method 500 may include the system and/or one or more components of the system. Additionally, or alternatively, a non-transitory computer-readable medium may store one or more instructions that, when executed by the system, cause the system to perform the method 500.

As shown in FIG. 5, the method 500 may include powering a memory device using power from a battery based on a voltage satisfying a voltage threshold (block 510). As further shown in FIG. 5, the method 500 may include powering the memory device using power from a power hold-off circuit based on the voltage not satisfying the voltage threshold (block 520).

The method 500 may include additional aspects, such as any single aspect or any combination of aspects described below and/or described in connection with one or more other methods or operations described elsewhere herein.

In a first aspect, the method 500 includes connecting a step-up regulator based on the voltage satisfying the voltage threshold or disconnecting the step-up regulator based on the voltage not satisfying the voltage threshold.

In a second aspect, alone or in combination with the first aspect, the method 500 includes connecting a step-down regulator based on the voltage not satisfying the voltage threshold or disconnecting the step-down regulator based on the voltage satisfying the voltage threshold.

In a third aspect, alone or in combination with one or more of the first and second aspects, the method 500 includes receiving current from a battery based on the voltage satisfying the voltage threshold or not receiving current from the battery based on the voltage not satisfying the voltage threshold.

In a fourth aspect, alone or in combination with one or more of the first through third aspects, the method 500 includes detecting whether the voltage satisfies the voltage threshold.

Although FIG. 5 shows example blocks of a method 500, in some implementations, the method 500 may include additional blocks, fewer blocks, different blocks, or differently arranged blocks than those depicted in FIG. 5. Additionally, or alternatively, two or more of the blocks of the method 500 may be performed in parallel. The method 500 is an example of one method that may be performed by one or more devices described herein. These one or more devices may perform or may be configured to perform one or more other methods based on operations described herein.

In some implementations, a system includes a battery; a power hold-off circuit, wherein the power hold-off circuit comprises: a step-up regulator; a step-down regulator; a first APL switch; a second APL switch; and one or more power hold-off capacitors; and a third APL switch that is located in a path between the battery and the power hold-off circuit, wherein the third APL switch is in a closed state, the first APL switch is in the closed state, and the second APL switch is connected to the step-up regulator when a voltage from the battery satisfies a voltage threshold; and wherein the third APL switch is in an open state, the first APL switch is in the open state, and the second APL switch is connected to the step-down regulator when the voltage from the battery does not satisfy the voltage threshold.

In some implementations, a system includes a memory device; and a power hold-off circuit, wherein the power hold-off circuit comprises: a step-up regulator; a step-down regulator; a first APL switch; a second APL switch; and one or more power hold-off capacitors, wherein the memory device is configured to receive power from the power hold-off circuit when the first APL switch is in an open state and the second APL switch is connected to the step-down regulator.

In some implementations, an apparatus includes means for powering a memory device using power from a battery based on a voltage satisfying a voltage threshold; and means for powering the memory device using power from a power hold-off circuit based on the voltage not satisfying the voltage threshold.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A system, comprising:

a battery;

a power hold-off circuit, wherein the power hold-off circuit comprises:

a first abrupt power-loss (APL) switch coupled to a step-up regulator, the step-up regulator coupled to one or more power hold-off capacitors and selectively coupled to a second APL switch;

a step-down regulator coupled to the one or more power hold-off capacitors and coupled to the second APL switch;

and a third APL switch that is located in a path between the battery and the power hold-off circuit, wherein the third APL switch is in a closed state, the first APL switch is in the closed state, and the second APL switch is connected to the step-up regulator when a voltage from the battery satisfies a voltage threshold; and wherein the third APL switch is in an open state, the first APL switch is in the open state, and the second APL switch is connected to the step-down regulator when the voltage from the battery does not satisfy the voltage threshold.

2. The system of claim 1, further comprising:

a first set of components;

a second set of components that includes a memory device;

a first pre-regulator that is located in a path between the battery and the first set of components; and a second pre-regulator,
wherein the second pre-regulator is located in a path between the battery and the second set of components when the third APL switch is in the closed state; and
wherein the second pre-regulator is located in a path between the power hold-off circuit and the second set of components when the third APL switch is in the open state.

3. The system of claim 2, wherein the first set of components and the second set of components receive power from the battery when the third APL switch is in the closed state, the first APL switch is in the closed state, and the second APL switch is connected to the step-up regulator.

4. The system of claim 2, wherein the one or more power hold-off capacitors are in a charging state when the third APL switch is in the closed state, the first APL switch is in the closed state, and the second APL switch is connected to the step-up regulator.

5. The system of claim 2, wherein the second set of components receive power from the one or more power hold-off capacitors when the third APL switch is in the open state, the first APL switch is in the open state, and the second APL switch is connected to the step-down regulator.

6. The system of claim 5, wherein the first set of components do not receive power from the one or more power hold-off capacitors.

7. The system of claim 2, further comprising:
a capacitor that is located in a path between the first pre-regulator and the battery; and
another capacitor that is located in a path between the second pre-regulator and the battery when the third APL switch is in the closed state, the first APL switch is in the closed state, and the second APL switch is connected to the step-up regulator.

8. The system of claim 2, further comprising:
a connector that is connected to the battery;
a voltage detection circuit that is connected to the connector; and
a filter that is connected to the voltage detection circuit.

9. The system of claim 2, wherein the one or more power hold-off capacitors are configured to hold a charge for a time after an APL event is detected.

10. The system of claim 9, wherein the time is based at least in part on a time for the memory device to save data after an occurrence of the APL event.

11. The system of claim 10, wherein the occurrence of the APL event is based at least in part on the battery being disconnected from the first set of components and the second set of components.

12. The system of claim 1, wherein the voltage threshold is between five volts and six volts.

13. A system, comprising:
a memory device; and
a power hold-off circuit, wherein the power hold-off circuit comprises:
a first abrupt power-loss (APL) switch coupled to a step-up regulator, the step-up regulator coupled to one or more power hold-off capacitors and selectively coupled to a second APL switch; and
a step-down regulator coupled to the one or more power hold-off capacitors and coupled to the second APL switch,
wherein the memory device is configured to receive power from the power hold-off circuit when the first APL switch is in an open state and the second APL switch is connected to the step-down regulator.

14. The system of claim 13, wherein the memory device, to receive power from the power hold-off circuit, is configured to receive power from the power hold-off circuit based on the one or more power hold-off capacitors being in a discharging state.

15. The system of claim 13, wherein the first APL switch is in the open state and the second APL switch is connected to the step-down regulator based on a voltage not satisfying a voltage threshold.

16. The system of claim 13, wherein the memory device is configured to receive power from a battery, and to not receive power from the power hold-off circuit, when the first APL switch is in a closed state and the second APL switch is connected to the step-up regulator.

17. The system of claim 16, wherein the first APL switch is in the closed state and the second APL switch is connected to the step-up regulator based on a voltage satisfying a voltage threshold.

18. The system of claim 13, further comprising:
a battery; and
a third APL switch that is located in a path between the battery and the power hold-off circuit.

19. The system of claim 18, wherein the third APL switch is in a closed state when a voltage from the battery satisfies a voltage threshold and is in an open state when the voltage from the battery does not satisfy the voltage threshold.

20. The system of claim 13, further comprising:
a pre-regulator that is located in a path between the memory device and the second APL switch; and
a capacitor that is located in a path between the pre-regulator and the second APL switch.

21. An apparatus, comprising:
means for powering a memory device using power from a battery based on a voltage satisfying a voltage threshold;
means for powering the memory device using power from a power hold-off circuit based on the voltage not satisfying the voltage threshold;
means for connecting a step-up regulator to a second abrupt power-loss (APL) switch by a first APL switch based on the voltage satisfying the voltage threshold; and
means for disconnecting the step-up regulator from the second APL switch by the first APL switch based on the voltage not satisfying the voltage threshold.

22. The apparatus of claim 21, further comprising means for connecting a step-down regulator to a third APL switch by the second APL switch based on the voltage not satisfying the voltage threshold and means for disconnecting the step-down regulator from the third APL switch by the second APL switch based on the voltage satisfying the voltage threshold.

23. The apparatus of claim 21, further comprising means for receiving current from a battery based on the voltage satisfying the voltage threshold and means for not receiving current from the battery based on the voltage not satisfying the voltage threshold.

24. The apparatus of claim 21, further comprising means for detecting whether the voltage satisfies the voltage threshold.

25. The apparatus of claim 21, wherein the voltage threshold is between five volts and six volts.

* * * * *